(12) United States Patent
Krogsgaard et al.

(10) Patent No.: US 8,284,963 B2
(45) Date of Patent: Oct. 9, 2012

(54) METHOD AND APPARATUS FOR DIMINISHING MISMATCH EFFECTS BETWEEN SWITCHED SIGNALS

(75) Inventors: Klaus Krogsgaard, Lyngby (DK); Eric Labbe, Sunnyvale, CA (US)

(73) Assignee: Texas Instruments Incorporated, Dallas, TX (US)

( * ) Notice: Subject to any disclaimer, the term of this patent is extended or adjusted under 35 U.S.C. 154(b) by 1083 days.

(21) Appl. No.: 12/196,496

(22) Filed: Aug. 22, 2008

(65) Prior Publication Data

US 2009/0066413 A1    Mar. 12, 2009

Related U.S. Application Data

(60) Provisional application No. 60/971,454, filed on Sep. 11, 2007.

(51) Int. Cl.
*H02B 1/00* (2006.01)
*H03F 99/00* (2009.01)
*H03F 1/02* (2006.01)
*H03F 3/38* (2006.01)
*H03F 3/68* (2006.01)

(52) U.S. Cl. ............ 381/123; 381/120; 381/121; 330/9; 330/10; 330/124 D

(58) Field of Classification Search .............. 330/10, 330/9, 124 D
See application file for complete search history.

(56) References Cited

U.S. PATENT DOCUMENTS

| | | | |
|---|---|---|---|
| 6,246,222 B1 * | 6/2001 | Nilles et al. | 323/283 |
| 6,731,162 B2 * | 5/2004 | Yeongha et al. | 330/10 |
| 6,847,257 B2 * | 1/2005 | Edwards et al. | 330/10 |
| 7,528,650 B2 * | 5/2009 | Song et al. | 330/10 |
| 7,598,895 B1 * | 10/2009 | Khoury | 341/152 |
| 2003/0006838 A1 * | 1/2003 | Yeongha et al. | 330/10 |
| 2005/0099231 A1 * | 5/2005 | Sutardja | 330/251 |
| 2006/0055381 A1 * | 3/2006 | Rice | 323/271 |
| 2006/0103458 A1 * | 5/2006 | Hansen et al. | 330/10 |
| 2009/0016539 A1 * | 1/2009 | Watanabe | 381/22 |
| 2009/0243744 A1 * | 10/2009 | Beale et al. | 332/109 |

* cited by examiner

*Primary Examiner* — Kiesha Bryant
*Assistant Examiner* — Dmitriy Yemelyanov
(74) *Attorney, Agent, or Firm* — John J. Patti; Wade J. Brady, III; Frederick J. Telecky, Jr.

(57) ABSTRACT

A circuit for diminishing mismatch effects between at least two switched signals includes at least three processing circuits configured to receive at least two switched signals such that each of the switched signals is associated with one of the processing circuits leaving at least one unassociated processing circuit. A controller circuit is configured to switch one of the switched signals to be associated with one of the unassociated processing circuit(s) upon at least one specified interval such as, for example, at a transition of the switched signal. The circuit may be incorporated into an audio amplifier configured to provide information carried on the switched signals to one or more speakers that provide an audio output. A one-processor circuit approach includes switching frames of a switched signal between positive and negative inputs of a processor circuit to average out errors introduced by the processor circuit.

9 Claims, 5 Drawing Sheets

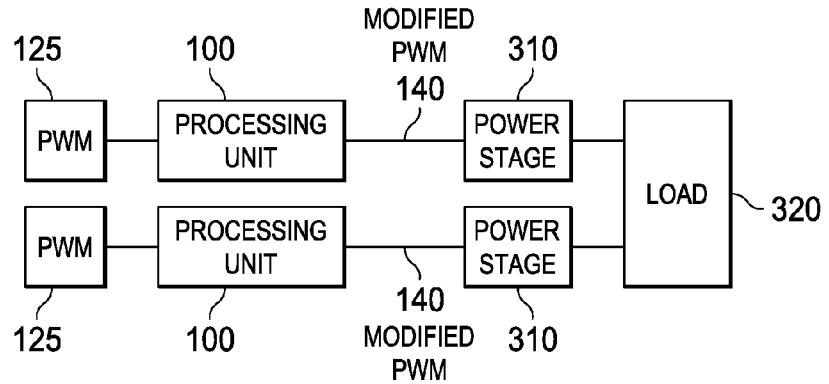
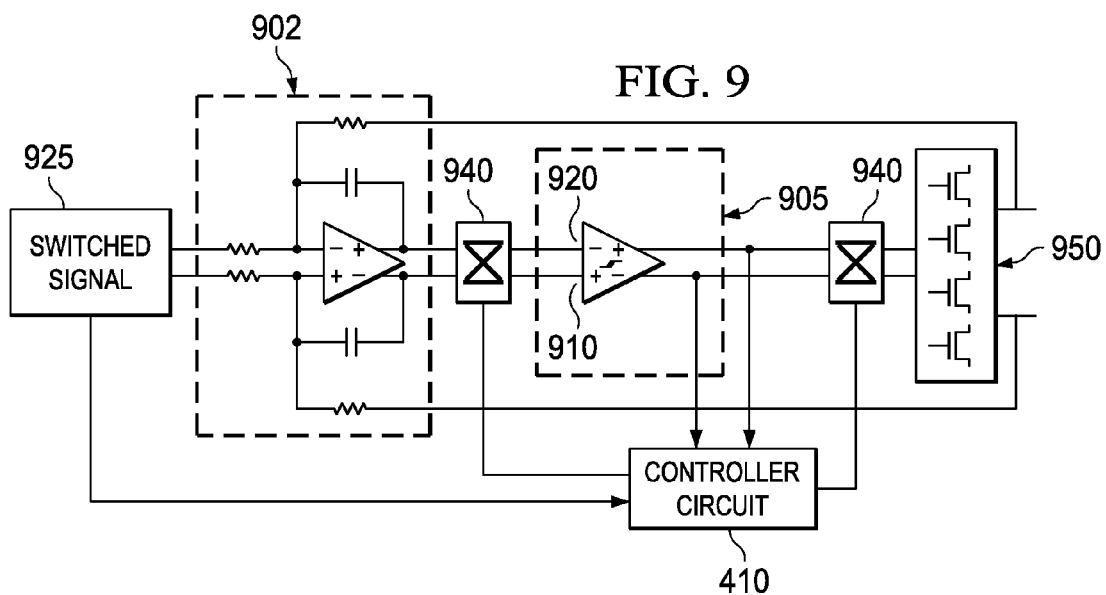

METHOD AND APPARATUS FOR DIMINISHING MISMATCH EFFECTS BETWEEN SWITCHED SIGNALS

RELATED APPLICATION(S)

This application claims the benefit of U.S. Provisional application No. 60/971,454, filed Sep. 11, 2007, which is incorporated by reference in its entirety herein.

TECHNICAL FIELD

This invention relates generally to circuitry for amplifiers and more specifically to circuitry for audio amplifiers and signal conditioning.

BACKGROUND

Various circuits for controlling electronic signals provided to audio speakers are known. In general, electric signals carry information to the speakers that then convert the information into sound. The electrical signals that carry the information may come in a variety of forms. For example, in certain devices, a pulse width modulated ("PWM") signal may carry the audio data to the speaker for playback. By one approach, PWM signals carry information via a stream of pulses wherein variation in the width of the pulses conveys the information.

Electric amplifiers are provided in the circuits that convey information to a speaker. Generally, however, during power up of amplifiers connected to speakers, a spike in current or in the signal provided to the speaker can provide undesirable audio artifacts such as cracks or pops. To reduce such artifacts during power up, in the example of a PWM signal amplified system, the PWM signal may be modified to ramp up from a low level to a normal level at power up to reduce spiking of the signal.

Certain such systems for providing information to a speaker divide the signal that is used to provide information into two or more switched signals that are provided at the speaker to convey sound information. Although the signals may be processed through essentially identical circuit elements, inherent variations in the qualities of the elements may contribute to mismatch between the signals. Such mismatch errors can create unpleasant audio artifacts or otherwise degrade the quality of sound produced by the speaker.

SUMMARY

Generally speaking, pursuant to these various embodiments, a circuit for diminishing mismatch effects between at least two switched signals includes at least three processing circuits configured to receive at least two switched signals such that each of the switched signals is associated with one of the processing circuits leaving at least one unassociated processing circuit. A controller circuit is in communication with the switched signals and is configured to switch one of the switched signals to be associated with one of the unassociated processing circuit(s) upon at least one specified interval such as, for example, at a transition of the switched signal. The circuit may be incorporated into an audio amplifier configured to provide information carried on the switched signals to one or more speakers that provide an audio output.

A method for reducing differential effects between at least two switched signals comprises receiving at least two switched signals, associating each switched signal with a processor circuit such that there is at least one unassociated processor circuit, and distributing error introduced by the processor circuits by switching one of the at least two switched signals to be associated with one unassociated processor circuit at specified intervals upon detecting a feature of the one of the at least two switched signals.

So configured, by periodically switching the switching signals among a plurality of processing circuits, errors inherent in the processing circuits are spread among the switching signals and are thereby averaged out among the signals. By spreading the signal errors introduced by the circuit elements among the switching signals, audible artifacts caused by mismatch between the switching signals are reduced.

BRIEF DESCRIPTION OF THE DRAWINGS

The above needs are at least partially met through provision of the method and apparatus for diminishing mismatch effects between switched signals described in the following detailed description, particularly when studied in conjunction with the drawings, wherein:

FIG. 3 comprises a block diagram of a known circuit for providing electrical signals to a load;

FIG. 9 comprises a block diagram for an example one-processor circuit application as configured in accordance with various embodiments of the invention.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above except where different specific meanings have otherwise been set forth herein.

DETAILED DESCRIPTION

Generally speaking, pursuant to these various embodiments, a circuit for diminishing mismatch effects between at least two switched signals includes at least three processing circuits configured to receive at least two switched signals such that each of the switched signals is associated with one of the processing circuits leaving at least one unassociated processing circuit. A controller circuit is in communication with the switched signals and is configured to switch one of the switched signals to be associated with one of the unassociated processing circuit(s) upon at least one specified interval such as, for example, at a transition of the switched signal. The circuit may be incorporated into an audio amplifier configured to provide information carried on the switched signals to one or more speakers that provide an audio output.

So configured, by periodically switching the switching signals among a plurality of processing circuits, errors inherent in the processing circuits are spread among the switching signals and are thereby averaged out among the signals. By spreading the signal errors introduced by the circuit elements among the switching signals, audible artifacts caused by mismatch between the switching signals are reduced.

Figure 1:
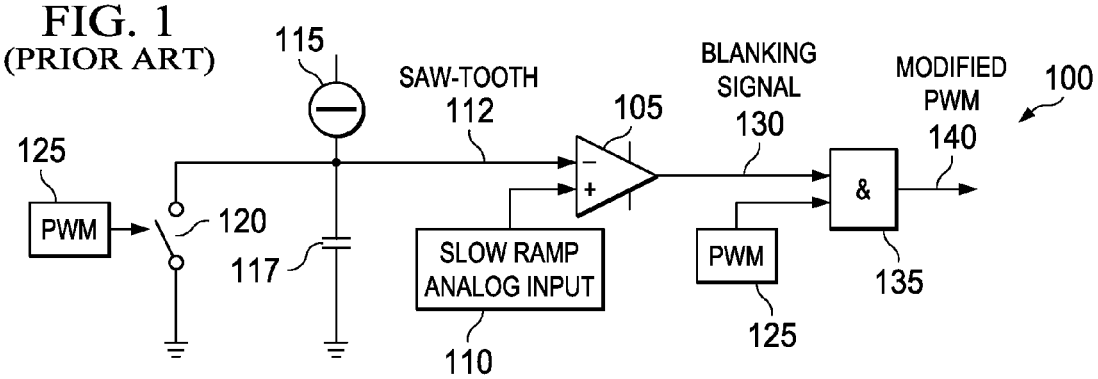
FIG. 1 comprises a circuit diagram for an example processing circuit.

These and other benefits may become clearer upon making a thorough review and study of the following detailed description. Referring now to the drawings, and in particular to FIG. 1, an illustrative processor circuit 100 used in a circuit for providing information to a speaker with a slow common mode ramping at start up feature will be described. The processor circuit 100 includes a comparator 105. The comparator 105 receives the slow ramp analog input 110 signal from a known source or circuit. A saw-tooth signal 112 is provided to the other input of the comparator 105. The saw-tooth signal 112 is created using a current source 115 coupled across a capacitor 117 and a switch 120. When the switch 120 is closed, the voltage at the negative input of the comparator 105 drops to zero or ground. When the switch 120 is open, the voltage at the negative input of the comparator 105 will rise. This rise followed by a drop to zero gives rise to a saw-tooth signal 112. The switch 120 is controlled by a pulse width modulated signal 125, which is provided by other circuitry known in the art. The comparator 105 provides an output blanking signal 130 that is high when the slow ramp analog input signal 110 is greater than the saw-tooth signal 112, and the comparator 105 provides an output blanking signal 130 that is low when the slow ramp analog input signal 110 is less than the saw-tooth signal 112.

A logic circuit 135 combines the blanking signal 130 and the pulse width modulated signal 125 to output a modified pulse width modulated signal 140. As will be described further below, the blanking signal 130 is so named because it acts to negate or erase portions of the pulse width modulated signal 125 at the logic circuit 135.

Figure 2:
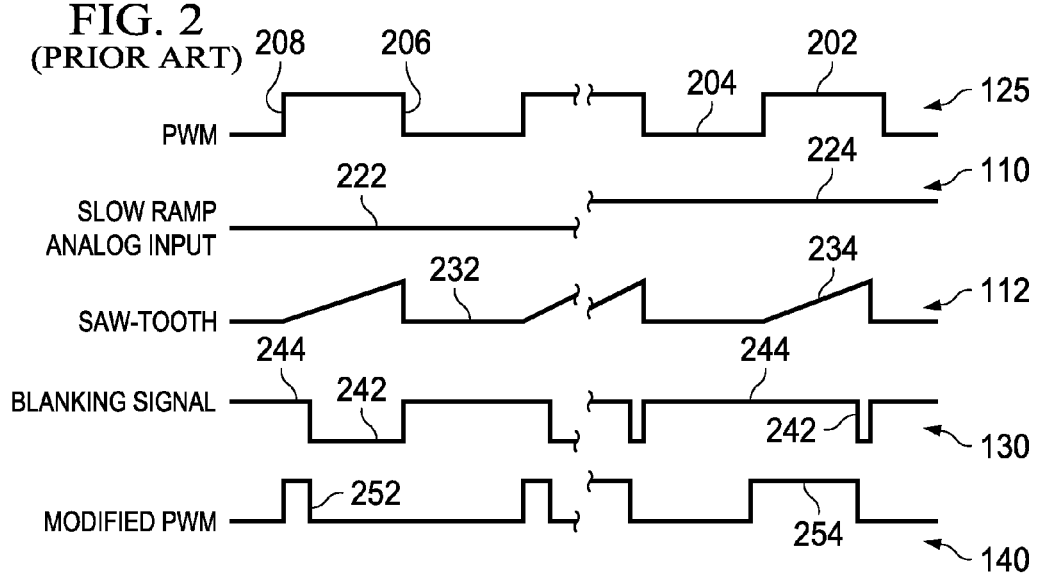
FIG. 2 comprises a comparison of a plurality of signals at various portions of the circuit of FIG. 1.

Examples of the types of signals that can be provided at various portions of the processor circuit 100 are illustrated in FIG. 2. The pulse width modulated signal 125 is a simple square wave having high portions 202 and low portions 204. Variations in the timing of the transitions of the pulse width modulated signal 125 typically carry the audio information. Known circuitry controls the switch 120 in response to the pulse width modulated signal 125 by opening the switch at high portions 202 and closing the switch 120 at low portions 204.

The slow ramp analog input signal 110 is a long, slowly increasing voltage signal, also created by known circuitry, that is applied to the amplifier at start up to reduce audio artifacts that may occur if the mode of operation changing or normal mode is immediately introduced at start up. In FIG. 2, the first portion 222 of the signal 110 is low and a second portion 224 later in time is higher. The saw-tooth signal 112 includes low portions 232 caused by having the switch 120 closed at low portions 204 of the pulse width modulated signal 125. High portions 234 of the saw-tooth signal 112 are caused by the ramping of voltage across the capacitor 117 when the switch 120 is open at high portions 202 of the pulse width modulated signal 125. The blanking signal 130 output by the comparator 105 includes a low output signal portion 242 output when the slow ramp analog input signal 110 provides a voltage lower than that of the saw-tooth signal 112. The blanking signal 130 also includes a high output signal portion 244 output when the slow ramp analog input signal 110 provides a voltage higher than that of the saw-tooth signal 112. By logically combining the pulse width modulated signal 125 with the blanking signal 130, the low output signal portions 242 cancel portions of the high portion 202 of the pulse width modulated signals 125. As a result, the modified pulse width modulated signal 140 has much smaller high portions 252 when the slow ramp input signal 110 is low, and the modified pulse width modulated signal 140 has larger high portions 254 when the slow ramp input signal 110 is high. In this manner, the duty cycle of the modified pulse width modulated signal 140 provided to the speaker is significantly reduced at power up, thereby reducing audible clicks or pops as may be heard when a system is powered on. An example of an electrical module using this method can be found in the TAS5102 class-D audio amplifier device from Texas Instruments, Inc.

The pulse width modulated signals 125 are sometimes split among two or more processing circuits 100 in an audio system to provide differential inputs, for example to effectively double a voltage range as observed at the speaker. An example of such a system will be described with reference to FIG. 3. In the example, the input signal, the pulse width modulated signal 125, is split and processed by separate processing circuits 100. The modified pulse width modulated signals 140 output by the processing circuits 100 are processed by identical power stage circuits 310 to condition the signals for introduction to the load 320, which is a speaker in audio systems. Such systems having split inputs are desirable for a number of reasons, but variations in the processing circuits 100 can cause variations between modified pulse width modulated signals such that they no longer match. Variations among essentially identical processing circuits 100 although typically small are common. Such variations can be caused by process variations, parasitic effects caused by adjacent traces, and other variables and can result in small variations in ramp rates (for example, caused by mismatch between the source 115 and the capacitor 117 of the different processing circuits 100) and/or blanking signals (for example, caused by comparator offset). Mismatch between the signals can cause negative effects in the playback by the speaker 320.

Figure 4:
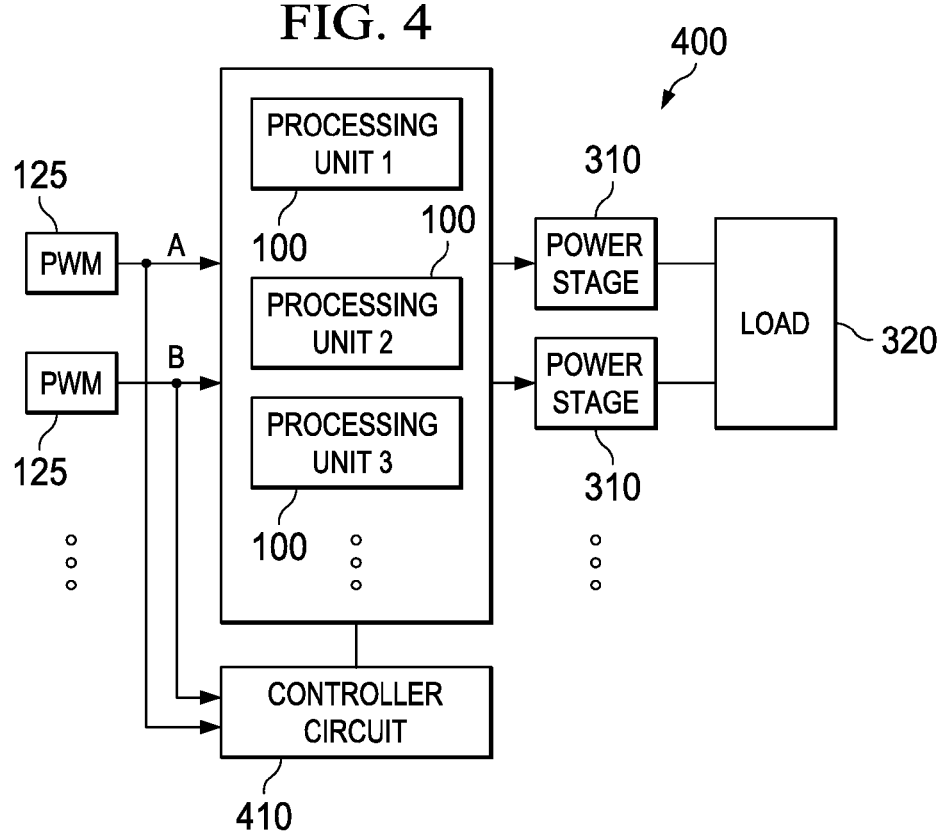
FIG. 4 comprises a block diagram for an example circuit as configured in accordance with various embodiments of the invention.

One approach to diminishing the mismatch effects caused by the variations in the processing circuits 10 includes rotating the pulse width modulated signals 125 among the processing circuits 100. One example system for implementing such an approach is illustrated in FIG. 4. The circuit 400 includes at least three processing circuits 100 configured to receive at least two switched signals 125, such as pulse width modulated signals, such that each of the at least two switched signals 125 is associated with one of the processing circuits 100 leaving at least one unassociated processing circuit 100. A controller circuit 410 in communication with the at least two switched signals 125 is configured to switch one of the at least two switched signals 125 to be associated with an unassociated processing circuit 100 upon at least one specified interval. The controller circuit 410 controls the routing of the switched signals 125 among the processing circuits 100 through control of a simple switching or multiplexer circuit, as are known in the art and need no further discussion herein.

By one approach, the controller circuit 410 operates by being configured to detect a predetermined feature of the at least two switched signals as the at least one specified interval. For example, the controller circuit 410 may sense for a transition of the switched signal. With brief reference to FIG. 2, this predetermined feature, for example, may be a falling edge 206 or a rising edge 208 of the switched signal 125, although other features of a given signal may be detected to trigger switching among the processing circuits 100. The controlling circuit 410 in such an approach will include known circuitry for sensing the rising or falling transitions of the switched signals. For example, the controller circuit 410 may be configured to switch the switched signal 125 with the sensed predetermined feature to be associated with one of the at least one unassociated processing circuits 100 upon detecting the predetermined feature. In the example of the TAS5102 class-D audio amplifier device from Texas Instruments, Inc., the switched signals 125 are offset in time by about 50 nanoseconds, which allow the controller circuit 410 to distinguish and switch the switched signals 125 without introducing excess noise.

By switching the switched signals 125 among the processing circuits 100, the error introduced by each processing circuit 100 is spread out among the switched signals 125. These errors are, as a consequence, averaged out at the load as the switched signals 125 are combined at the load. By switching the switched signals 125 among the processing circuits 100 at the transition of the switched signal, side effects caused by the switch are reduced. Also, by using the switching signal 125 to drive the transition, additional control or clocking signals for the transition are not needed.

Figure 5:
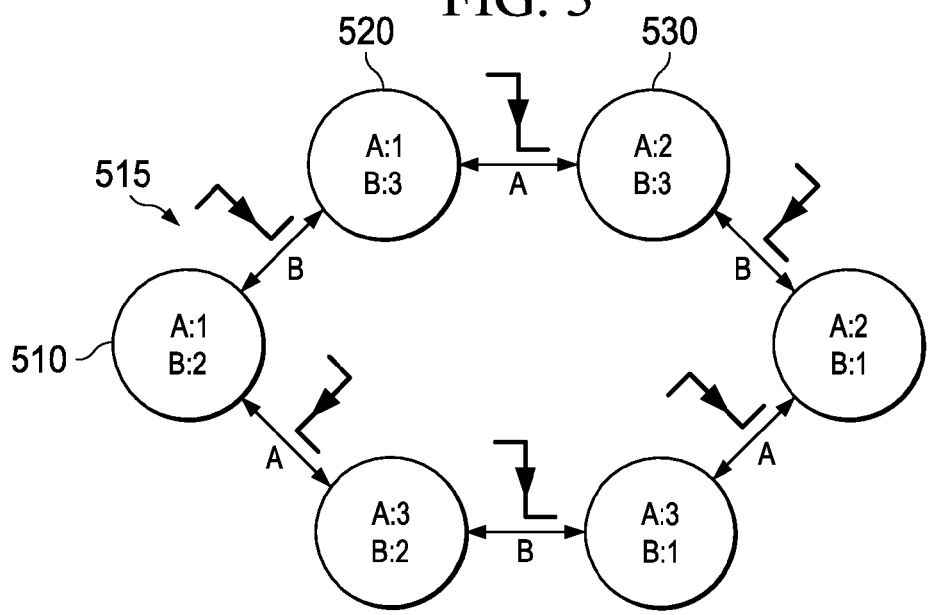
FIG. 5 comprises a logic diagram demonstrating the behavior of a three processing circuit example as configured in accordance with various embodiments of the invention.

A further illustration of the operation of one such circuit receiving two switched signals 125, having three processor circuits 100, and switching the switched signals at the falling edge of the switched signals 125 will be described with reference to FIG. 5. If, for example, the circuit 400 begins operation with the pulse width modulated signal 125 designated in FIG. 4 with an "A" associated with the processor circuit 100 designated with a "1" and the pulse width modulated signal 125 designated with a "B" associated with the processor circuit 100 designated with a "2," the state bubble designated 510 describes this circuit state. The controller circuit 410 senses the switched signals 125, waiting to determine whether one of the signals has a falling edge. If switched signal B has a falling edge before switched signal A, then the controller circuit 410 switches switched signal B to the unassociated processor circuit 100, the circuit designated circuit "3." On FIG. 5, this state change is represented a falling edge 515 for switched signal B leading to the state bubble designated 520 describing the circuit state as switched signal A associated with processor circuit 1 and switched signal B associated with processor circuit 3. Again, the controller circuit 410 senses the switched signals 125, waiting to determine whether one of the signals has a falling edge. If switched signal B has the falling edge before switched signal A, the circuit 400 will shift states to the state represented in state bubble 510. If switched signal A has the falling edge before switched signal B, the controller circuit 410 will associate switched signal A with the unassociated processor circuit 100, in this case processor circuit "2," and this state is represented in state bubble designated 530. The controlling circuit 410 will follow the logic represented in FIG. 5 for all subsequent falling edges detected in the switched signals 125.

Figure 6:
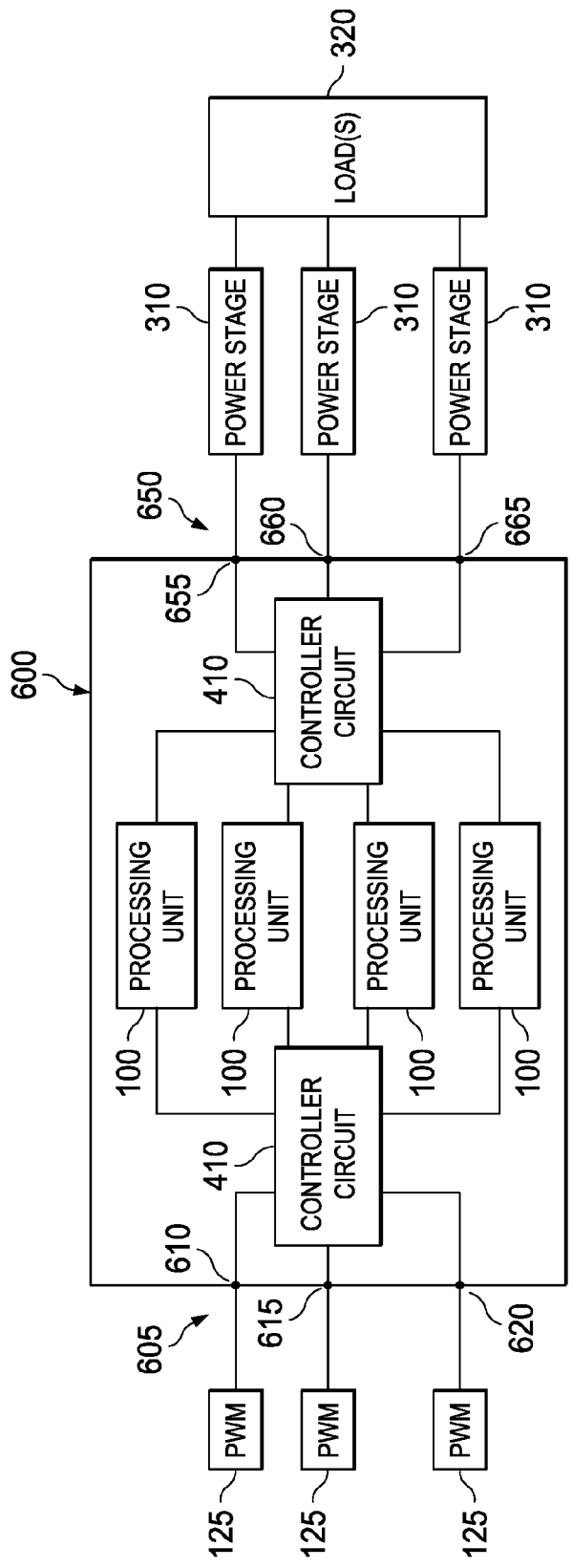
FIG. 6 comprises a block diagram for an example audio amplifier as configured in accordance with various embodiments of the invention.

With reference to FIG. 6, a circuit having features as described above may be incorporated into an audio amplifier 600. For example, the audio amplifier 600 may include an input 605 configured to receive at least one switched signal 125. The input 605 may comprise a plurality of input pins 610, 615, and 620 to the amplifier 600. The switched signal, shown as pulse width modulated signals 125 in the example of FIG. 6, may be supplied to the input 605 from separate sources. The amplifier 600 includes a plurality of processing circuits 100 such that there are more processor circuits 100 than switched signals 125. The controller circuit 410 is connected and configured to associate each switched signal 125 with one of the plurality of processor circuits 100 and to switch one of the switched signals 125 to an unassociated processor circuit 100 at a specified interval as described above. The amplifier 600 also includes an output 650 for at least one processed switched signal(s). For example, the output 650 may include output pins 655, 660, and 665 to provide the processed switched signals to power stage circuits 310 for signal conditioning before being provided to the load 320. Those skilled in the art will recognize and appreciate that such an audio amplifier 600 may comprise a separate chip with all the relevant circuitry disposed thereon or a plurality of interconnected platforms. The power stage circuits 310, for example, may also be included on a single chip or on the same board with (or be fully separated from) the audio amplifier 600.

Figure 7:
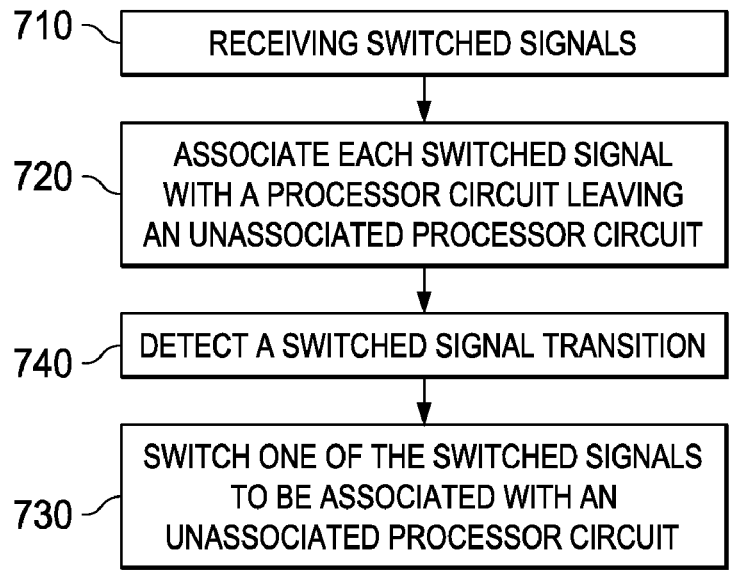
FIG. 7 comprises a flow diagram of a process as configured in accordance with various embodiments of the invention.

A method for reducing differential effects between at least two switched signals will be described with reference to FIG. 7. At step 710, a circuit receives at least two switched signals. Each switched signal is associated at step 720 with a processor circuit 100 such that there is at least one unassociated processor circuit 100. At step 730, one of the at least two switched signals is switched to be associated with one unassociated processor circuit 100 upon detecting a feature of the one of the at least two switched signals. This step 730 may include detecting a transition of the switched signal, illustrated at step 740, as may be performed by the controller circuit 410. As discussed above, detecting a feature of the switched signals may include detecting a falling edge of the switched signal or detecting a leading edge of the switched signal to reduce introduction of noise during the chopping or rotating of the signals among the processor circuits 100.

So configured, by switching the switching signals among a plurality of processing circuits, errors inherent in the processing circuits are distributed among all the switching signals. For instance, by switching at every falling edge, the errors introduced by the processing circuits are distributed among every pulse of each switching signal thereby distributing the errors. By spreading the signal errors introduced by the circuit elements among the switching signals, audible artifacts caused by mismatch between the switching signals are reduced.

Figure 8:
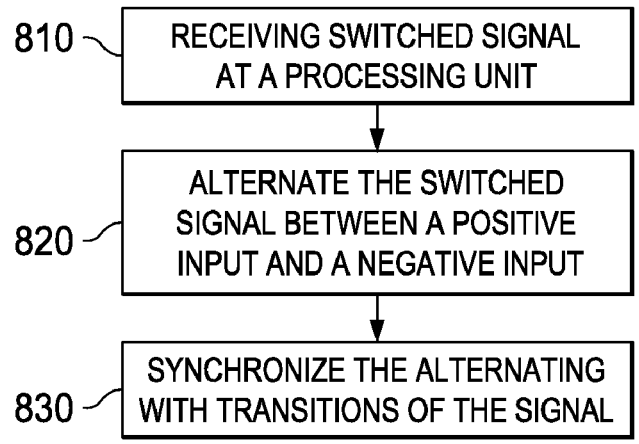
FIG. 8 comprises a flow diagram of a process as configured in accordance with various embodiments of the invention.

The concept of rotating or chopping switched signals among processing units to distribute and/or average error introduced by the processing units can be applied in a single processing unit. One such approach will be described with reference to FIGS. 8 and 9. A method of reducing an effect of error in a processor for processing switched signals may include at step 810 receiving a switched signal 925, typically through a feedback/modulator circuit 902, at a processing circuit 905 with a positive input 910 and a negative input 920. At step 820, the switched signal 925 is alternated between the positive input 910 and the negative input 920 of the processing circuit 905 by a chopping or rotating circuit 940 that is known in the art and controlled by the controller circuit 410. At step 830, the alternating step 820 is substantially synchronized with transitions of one of the switched signal 925 or the output signal of the processing circuit 905. As discussed above, a controller circuit 410 can sense the repeating portion of the switched signal 925 or the output signal of the processing circuit 905 and control the alternating of the signal between the positive input 910 and the negative input 920 of the processing circuit 905. The controller circuit 410 also controls the chopping or rotating of signals from the outputs of the processing circuit 905 before introduction to the power stages 950, which are analogous to the power stages 310 discussed above.

In a single processor circuit approach, the errors can be distributed much like in a multi-processor circuit approach. The concept for one switched signal works by considering the signal as differential, for example, a single-ended signal and a fixed reference. In the case of a PWM signal, each PWM frame (having both a high portion 202 and low portion 204) can be considered a characteristic period, where the inputs and outputs are phase-reversed in every other characteristic period. In the first period, the positive input 910 of the processing circuit 905 is connected to the positive input signal, the negative input 920 is connected to the negative input signal, the positive output is connected to the positive output signal, and the negative output is connected to the negative output signal; for the next period, the positive input of the processing circuit 905 is connected to the negative input signal and so on.

In this example, the phase ratio between the input signals and output signals remains constant while the processing circuit 905 alternates between in-phase and reverse-phase. By doing so, a possible deterministic error in the processing circuit 905 (for example, input offset or propagation delay asymmetry of a comparator) will be averaged out over two characteristic periods. Synchronizing the chopping action to the switched signal or the output signal of the processing circuit 905 in FIG. 9 provides this additional error reduction benefit. By switching the switched signals between the processing circuits inputs 910 and 920 at the transition of the switched signal, side effects caused by the switch are reduced. Also, by using the switching signal 925 or the output signal to drive the transition, additional control or clocking signals for the transition are not needed.

Those skilled in the art will recognize that a wide variety of modifications, alterations, and combinations can be made with respect to the above described embodiments without departing from the scope of the invention. For example, although the switched signals are described herein as pulse width modulated signals, the switched signals may also be pulse density modulated signals or any other switched signals having a repeating pattern. Such modifications, alterations, and combinations are to be viewed as being within the ambit of the inventive concept.

What is claimed is:

1. A circuit for diminishing mismatch effects between at least two switched signals comprising:
   at least three processing circuits configured to receive at least two switched signals such that each of the at least two switched signals is associated with one of the processing circuits leaving at least one unassociated processing circuit; and
   a controller circuit in communication with the at least two switched signals, the controller circuit configured to switch one of the at least two switched signals to be associated with one of the at least one unassociated processing circuit upon at least one specified interval, wherein the controller circuit is further configured to detect a predetermined feature of the at least two switched signals as the at least one specified interval, and wherein the controller circuit is configured to switch the switched signal with the predetermined feature to be associated with one of the at least one unassociated processing circuit upon detecting the predetermined feature.

2. The circuit for diminishing mismatch effects between at least two switched signals of claim 1 wherein the predetermined feature comprises a transition of the switched signal.

3. The circuit for diminishing mismatch effects between at least two switched signals of claim 1 wherein the predetermined feature comprises a falling edge of the switched signal.

4. The circuit for diminishing mismatch effects between at least two switched signals of claim 1 wherein the switched signals comprise at least one of a group comprising a pulse width modulated signal and a pulse density modulated signal.

5. An audio amplifier comprising:
   an input for receiving at least one switched signal;
   a plurality of processor circuits such that there are more processor circuits than switched signals;
   a controller circuit connected and configured to associate each switched signal with one of the plurality of processor circuits and to switch one of switched signals to an unassociated processor circuit at a specified interval such that error introduced by the processor circuits is distributed among the at least one switched signal, wherein the specified interval includes where the controller circuit is further configured to detect a predetermined feature of the switched signals such that an occurrence of the predetermined feature triggers the controller circuit to switch the switched signal with the predetermined feature to be associated with the unassociated processing circuit; and
   an output for at least one processed switched signal.

6. The audio amplifier of claim 5 wherein the predetermined feature comprises a transition of the switched signal.

7. The audio amplifier of claim 5 wherein the predetermined feature comprises at least one of a group comprising a falling edge of the switched signal and a leading edge of the switched signal.

8. The audio amplifier of claim 5 wherein the switched signals comprise at least one of a group comprising a pulse width modulated signal and a pulse density modulated signal.

9. An audio amplifier comprising:
   an input for receiving at least one switched signal;
   a plurality of processor circuits such that there are more processor circuits than switched signals;
   a controller circuit connected and configured to associate each switched signal with one of the plurality of processor circuits and to switch one of switched signals to an unassociated processor circuit at a specified interval such that error introduced by the processor circuits is distributed among the at least one switched signal; and
   an output for at least one processed switched signal, wherein the specified interval comprises where the controller circuit is further configured to detect a transition of the switched signals such that an occurrence of the transition triggers the controller circuit to switch the switched signal with the transition to be associated with the unassociated processing circuit.

* * * * *